United States Patent
Curcic

(10) Patent No.: US 11,056,985 B2
(45) Date of Patent: Jul. 6, 2021

(54) MICROELECTROMECHANICAL SYSTEM AND CONTROL METHOD TO CONTROL A PIEZOELECTRIC DRIVE BASED ON AN ADMITTANCE OR IMPEDANCE OF THE PIEZOELECTRIC DRIVE

(71) Applicant: Robert Bosch GmbH, Stuttgart (DE)

(72) Inventor: Michael Curcic, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 603 days.

(21) Appl. No.: 15/767,976

(22) PCT Filed: Oct. 19, 2016

(86) PCT No.: PCT/EP2016/075047
§ 371 (c)(1),
(2) Date: Apr. 12, 2018

(87) PCT Pub. No.: WO2017/067963
PCT Pub. Date: Apr. 27, 2017

(65) Prior Publication Data
US 2018/0358908 A1   Dec. 13, 2018

(30) Foreign Application Priority Data
Oct. 19, 2015  (DE) .......................... 102015220291.7

(51) Int. Cl.
*H02N 2/00*  (2006.01)
*H01L 41/04*  (2006.01)
*B81B 7/00*  (2006.01)
*G02B 26/08*  (2006.01)

(52) U.S. Cl.
CPC ............. *H02N 2/008* (2013.01); *B81B 7/008* (2013.01); *H01L 41/042* (2013.01); *B81B 2207/03* (2013.01); *G02B 26/0858* (2013.01)

(58) Field of Classification Search
CPC .... H02N 2/008; B81B 7/008; B81B 2207/03; H01L 41/042; G02B 26/0858
USPC .......................................................... 310/317
See application file for complete search history.

(56) References Cited

U.S. PATENT DOCUMENTS

| 5,714,831 | A | 2/1998 | Walker et al. |
| 2005/0219288 | A1* | 10/2005 | Vogeley ................ F04B 43/046 347/10 |
| 2005/0219302 | A1 | 10/2005 | Vogeley |
| 2010/0289381 | A1 | 11/2010 | Xu et al. |

(Continued)

FOREIGN PATENT DOCUMENTS

| DE | 4442033 A1 | 5/1996 |
| DE | 102005007327 A1 | 8/2006 |

(Continued)

OTHER PUBLICATIONS

International Search Report dated Feb. 6, 2017 of the corresponding International Application PCT/EP2016/075047 filed Oct. 19, 2016.

*Primary Examiner* — Shawki S Ismail
*Assistant Examiner* — Monica Mata
(74) *Attorney, Agent, or Firm* — Norton Rose Fulbright US LLP; Gerard Messina

(57) ABSTRACT

A microelectromechanical system includes a piezoelectric drive and a control unit coupled to the piezoelectric drive and designed to control the piezoelectric drive based on a change of the admittance and/or the impedance of the piezoelectric drive.

14 Claims, 3 Drawing Sheets

(56) References Cited

U.S. PATENT DOCUMENTS

| | | | |
|---|---|---|---|
| 2012/0200240 A1 | 8/2012 | Yoshida et al. | |
| 2013/0277776 A1 | 10/2013 | Herzum et al. | |
| 2016/0043298 A1* | 2/2016 | Bradley | H01L 41/044 |
| | | | 363/44 |

FOREIGN PATENT DOCUMENTS

| | | |
|---|---|---|
| DE | 102007054374 A1 | 5/2009 |
| DE | 102013207233 A1 | 10/2013 |
| WO | 2004041710 A1 | 5/2004 |
| WO | 2015034480 A1 | 3/2015 |

* cited by examiner

MICROELECTROMECHANICAL SYSTEM AND CONTROL METHOD TO CONTROL A PIEZOELECTRIC DRIVE BASED ON AN ADMITTANCE OR IMPEDANCE OF THE PIEZOELECTRIC DRIVE

CROSS-REFERENCE TO RELATED APPLICATIONS

The present application is the national stage of International Pat. App. No. PCT/EP2016/075047 filed Oct. 19, 2016, and claims priority under 35 U.S.C. § 119 to DE 10 2015 220 291.7, filed in the Federal Republic of Germany on Oct. 19, 2015, the content of each of which are incorporated herein by reference in their entireties.

FIELD OF THE INVENTION

The present invention relates to a microelectromechanical system and a corresponding control method.

BACKGROUND

Microelectromechanical systems, also referred to as MEMS, are presently used in a variety of applications, for example, in sensors or micromirrors. In particular, piezoelectric actuators are used in such systems in order to, for example, deflect a micromirror. For the exact control of such MEMS systems and the corresponding piezoelectric actuators, their position and movement has to be detected and supplied to the particular controller.

Conventional MEMS systems typically have dedicated detection elements for detecting the position and movement of such MEMS actuators. Such detection elements can be designed, for example, as capacitive structures, the capacitance of which changes upon a movement of the MEMS actuator. Therefore, the position and movement of the MEMS actuator can also be concluded by a detection of the changing capacitance.

DE 4442033 A1 describes, for example, such a MEMS-based rotation rate sensor, in which capacitive elements are analyzed.

SUMMARY

According to an example embodiment of the present invention, a microelectromechanical system includes a piezoelectric drive, and a control unit coupled to the piezoelectric drive and designed to control the piezoelectric drive based on a change of the admittance and/or the impedance of the piezoelectric drive.

According to an example embodiment, a control method for a microelectromechanical system includes detecting a change of the admittance and/or the impedance of a piezoelectric drive of the microelectromechanical system, and controlling the piezoelectric drive based on the detected change of the admittance and/or the impedance of the piezoelectric drive.

A separate detection of the position and movement of the piezoelectric drive is complex and increases the complexity of the microelectromechanical system. Embodiments of the present invention are therefore provided by which to be able to exactly regulate a piezoelectric drive even without a separate position detection. For this purpose, the present invention provides embodiments allowing for the control of the piezoelectric drive solely using the admittance and/or the impedance of the piezoelectric drive itself.

In the resonance case, i.e., in resonant operation of the microelectromechanical system, the piezoelectric drive or the piezoelectric element which forms this drive expands and contracts. A length change of the piezoelectric element automatically also results in a capacitance change of the piezoelectric element. This change can be detected by a measurement of the current flowing through the piezoelectric drive or by measuring the admittance or impedance of the piezoelectric drive.

The control unit is therefore capable of detecting a change of the admittance and/or the impedance of the piezoelectric drive without using separate measuring elements for this purpose.

The present invention therefore enables the control of the piezoelectric drive without additional elements for detecting the present position of the piezoelectric drive. Time-consuming and complex process steps are thus saved during the manufacturing of the microelectromechanical system. Furthermore, the area required for the microelectromechanical system is reduced, connecting lines to the sensor elements which are otherwise required are saved, and pads which are otherwise required for contacting the sensor elements are saved.

In an example embodiment, the control unit is designed to provide to the piezoelectric drive in normal operation a control voltage, which has a DC voltage component and an AC voltage component overlaid on the DC voltage component. The AC voltage component is regularly less in absolute value than the DC voltage component. The voltage curve of the control voltage is thus continuously in the positive range. Normal operation is to be understood as operation in which the microelectromechanical system is operated according to the application, i.e., for example, a micromirror is set into oscillation. A permanent polarity reversal of the piezoelectric drive can be prevented by the DC voltage. The AC voltage component excites the piezoelectric drive into corresponding vibrations.

In an example embodiment, the microelectromechanical system includes a current measuring device designed to detect the current flowing through the piezoelectric drive and provide it to the control unit, the control unit being designed to excite the piezoelectric drive exclusively using an AC voltage component in a calibration phase and, during this excitation, to detect a first impedance of the piezoelectric drive based on the detected current. The frequency of the AC voltage component can be outside the resonance frequency of the piezoelectric drive. However, if the component of the piezoelectric drive is calibrated proportional to the frequency of the exciting voltage, it is possible to pass through the entire frequency range, including the frequencies in which the resonance frequency of the piezoelectric drive lies. In a piezoelectric drive, an excitation using an AC voltage component, whose frequency is at the resonance frequency of the piezoelectric drive, results in shift currents in the piezoelectric drive. However, to be able to analyze these shift currents, it is necessary to know the properties of the piezoelectric drive. This can be carried out by a measurement of the impedance of the piezoelectric drive. The feature of the piezoelectric drive thus to be determined can be, for example, the capacitance change of the piezoelectric drive per length change dCdx. For example, this variable can be determined with the aid of a capacitance-voltage measurement or an optical measurement on the piezoelectric drive. For the optical measurement, for example, the deflection of the piezoelectric drive can be optically detected.

In an example embodiment, the control unit is designed, in normal operation of the microelectromechanical system, to determine the amplitude of the vibration of the piezoelectric drive based on the first impedance and an electric current, which flows through the piezoelectric drive, detected in normal operation of the piezoelectric drive.

The so-called Butterworth-Van Dyke model can be used for modeling the piezoelectric drive. This model presumes that a piezoelectric drive is composed of a parasitic capacitance and a series resonant circuit parallel thereto made of L, C, and R, whose resonance frequency is typically in the range of several megahertz. A coupling of the piezoelectric drive to an element to be driven, which typically itself has a resonance at only a few kilohertz, represents an excitation outside the resonance of the piezoelectric drive. The piezoelectric drive is deformed as a result of the mechanical movement of the overall structure, whereby capacitance C of the piezoelectric drive changes. In the above-mentioned model, this can be viewed solely as a change of capacitance C, since L is negligibly small and R is typically also very small. The piezoelectric drive can therefore approximately be modeled as capacitance C.

The mechanics and the electronics can be formally linked as follows. Mechanical movement of the piezoelectric drive that can be described as $x=A(\Omega)\cos(\Omega t-\phi(\Omega))$, where $A(\Omega)$ is the amplitude of the deflection of the piezoelectric drive and the cosine term identifying the change with respect to time. Capacitance C of the piezoelectric drive can be described as $$C = dCdxd(\Omega)\cos(\Omega t-\phi(\Omega))+C0 \quad (1),$$

where C0 identifies the base capacitance of the piezoelectric drive.

Furthermore, the current flowing through the piezoelectric drive can be represented as $$\iota(t) = \frac{dQ(t)}{dt} = \frac{d(C(t) \cdot U(t))}{dt} = \frac{dC(t)}{dt} \cdot U(t) + \frac{dU(t)}{dt} \cdot C(t). \quad (2)$$

If first formula (1) is inserted into second formula (2) and u:=AC cos (at)+DC is assumed, the following formula results:

$$AcA(\Omega)\Omega dCdc \sin(-\phi(\Omega)+2\Omega r) \rightarrow DC \sin(\Omega t-\phi(\Omega))A(\Omega)\Omega dCdx - dC\Omega \sin^*\omega t)C0 \quad (3)$$

To determine the amplitude of the vibration of the piezoelectric drive, the component of formula (3) is observed which is proportional to the frequency of the AC voltage component of the control voltage and dCdx. Furthermore, component $AC*\Omega*\sin(*\Omega*t)*C0$ is interfering and can be taken into consideration by a suitable calibration as follows:

$$DC \sin(\Omega t-\phi(\Omega))A(\Omega)\Omega dCdx \quad (3.1).$$

The multiplication by $\cos(\Omega t)$ results in $$\tfrac{1}{2}DCA(\Omega)\Omega dCdx \sin(-\phi(\Omega)+2\Omega t)-\tfrac{1}{2}DCA(\Omega)\Omega dCdx \sin(\phi(\Omega)) \quad (4).$$

To obtain in-phase component X, the terms proportional to $2\Omega$ are deleted. Solely last term $X=-\tfrac{1}{2}*DC*A(\Omega)*dCdx*\sin(\Phi)(\Omega))$ is to be considered. To ascertain out-of-phase component Y, formula (3.1) is multiplied by $\sin(\Omega*t)$, and $Y=+\tfrac{1}{2}*DC*A(\Omega)*\Omega*dCdx*\cos(\Omega*t)$ results.

The square root of the sum of the squares of X and Y results as $\sqrt{X^2+Y^2}=\tfrac{1}{2}DCA(\Omega)\Omega dCdx$, where DC is the amplitude of the DC voltage component, $\Omega$ is the excitation frequency, i.e., the frequency of the AC voltage component, and dCdx is the capacitance change per length change of the piezoelectric drive. Present amplitude $A(\Omega)$ can thus be computed by simply rearranging the equation.

In an example embodiment, the control unit can include a controller, in particular a PI controller, which is designed to carry out an amplitude regulation of the piezoelectric drive based on the determined amplitude and a predefined setpoint amplitude. A PI controller enables an exact and simple regulation of the amplitude.

In an example embodiment, the control unit can be designed, in normal operation, to determine the phase of the vibration of the piezoelectric drive based on the first impedance and an electric current detected in normal operation of the piezoelectric drive, which flows through the piezoelectric drive.

Terms X and Y from above formula (4) can also be used to compute the phase of the vibration of the piezoelectric drive according to $$-\frac{X}{Y} = \tan(\phi(\Omega)),$$

so that the phase therefore results as $$-\arctan\left(\frac{X}{Y}\right) = \phi(\Omega).$$

In an example embodiment, the control unit can include a controller, in particular a PI controller, which is designed to carry out a phase regulation of the piezoelectric drive based on the determined phase and a predefined setpoint phase.

For the regulation in particular of the portion of the control voltage, which is proportional to the frequency of the AC voltage component of the control voltage, it is important that the term $-AC\ \Omega\ \sin(\Omega t)\ C0$ from formula (3) is compensated. This component can be ascertained, for example, in the case of activation of the piezoelectric drive without a DC voltage, since it is solely dependent on the AC voltage component of the control voltage. The term can thus be determined, for example, by an impedance/admittance measurement or a measurement of the current flowing through the piezoelectric drive.

If the piezoelectric drive has not only one actuator but rather two actuators, i.e., for example, two piezoelectric drive elements, which are excited differentially, a self-compensation can take place if the DC voltage components are negated by each other. With $$C1 = -dCdsA(\Omega)\cos(\Omega t - \phi(\Omega)) + C0$$

$$C2 = dCdtA(\Omega)\cos(\Omega t - \phi(\Omega)) + C0$$

$$U1 = AC\cos(\Omega t) + DC$$

$$U2 = -AC\cos(\Omega t) - DC,$$

the total current results as $2AC\ A(\Omega)\Omega dCdx\ \sin(2\Omega t-\phi(\Omega))+2DC\ A(\Omega)\sin(\Omega t-\phi(\Omega))\Omega dCdx$.

In comparison to formula 3, the terms have double the amplitude and the dependence on capacitance $C_0$ is omitted. Furthermore, the terms proportional to the DC voltage component of the control voltage are to be considered here. For the component of the control voltage which is proportional to the frequency of the AC voltage component of the control voltage, X and Y result similarly to the above description.

For the portion of the current through the piezoelectric actuator which is proportional to double the frequency of the AC voltage component of the control voltage, X and Y result as:

$$X = -\tfrac{1}{2} A C A(\Omega) \Omega dCdx \sin(\phi(\Omega))$$

$$Y = -\tfrac{1}{2} A C A(\Omega) \Omega dCdx \cos(\phi(\Omega))$$

This relationship also applies to only one drive element. Therefore:
$\sqrt{X^2+Y^2} = \tfrac{1}{2}$ AC $A(\Omega)\Omega dCdx$, from which amplitude $A(\Omega)$ in turn results.

The following accordingly results for the phase angle or the phase:

$$-\arctan\left(\frac{X}{Y}\right) = \phi(\Omega)$$

The above embodiments and refinements can be arbitrarily combined with one another, if reasonable. Further possible embodiments, refinements, and implementations of the present invention also include combinations, which are not explicitly mentioned, of features of the present invention described above or hereafter with respect to the exemplary embodiments. In particular, those skilled in the art will also add individual aspects as improvements or supplements to the particular basic form of the present invention.

The present invention will be explained in greater detail hereafter on the basis of the exemplary embodiments indicated in the schematic figures of the drawings in which identical or functionally identical elements and devices, if not indicated otherwise, have been provided with the same reference numerals.

DETAILED DESCRIPTION

Figure 1:
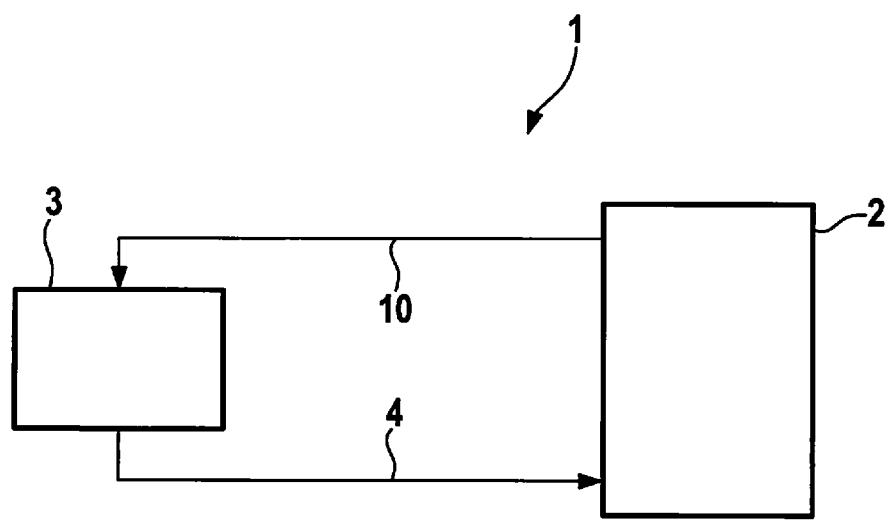
FIG. 1 is a block diagram of a microelectromechanical system according to an example embodiment of the present invention.

FIG. 1 is a block diagram of a microelectromechanical system 1 according to an example embodiment of the present invention including a piezoelectric drive 2 and a control unit 3, which drives piezoelectric drive 2.

For this purpose, control unit 3 generates a control voltage 4. Control voltage 4 has a DC voltage component 5 and an AC voltage component 6 overlaid on DC voltage component 5 (see FIG. 3). Piezoelectric drive 2 can thus be more or less pre-tensioned in the positive or negative direction by the DC voltage component. The actual vibration of piezoelectric drive 2 is induced by overlaid DC voltage component 6 of control voltage 4. A permanent polarity reversal of the piezoelectric drive may thus be avoided.

To generate control voltage 4, control unit 3 detects admittance 10 of piezoelectric drive 2 and sets control voltage 4 based on this variable.

Figure 2:
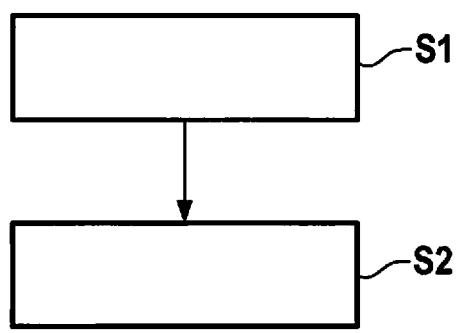
FIG. 2 is a flowchart of a method according to an example embodiment of the present invention.

FIG. 2 is a flowchart of a method according to an example embodiment of the present invention for a microelectromechanical system 1, 11.

The method begins with detection S1 of a change of admittance 10 and/or the impedance of a piezoelectric drive 2 of microelectromechanical system 1, 11. The amplitude and the phase of the piezoelectric drive can be computed based on the change of admittance 10 and/or the impedance, as described above.

In a second step S2, piezoelectric drive 2 is therefore controlled based on the detected change of admittance 10 and/or the impedance of piezoelectric drive 2.

Figure 3:
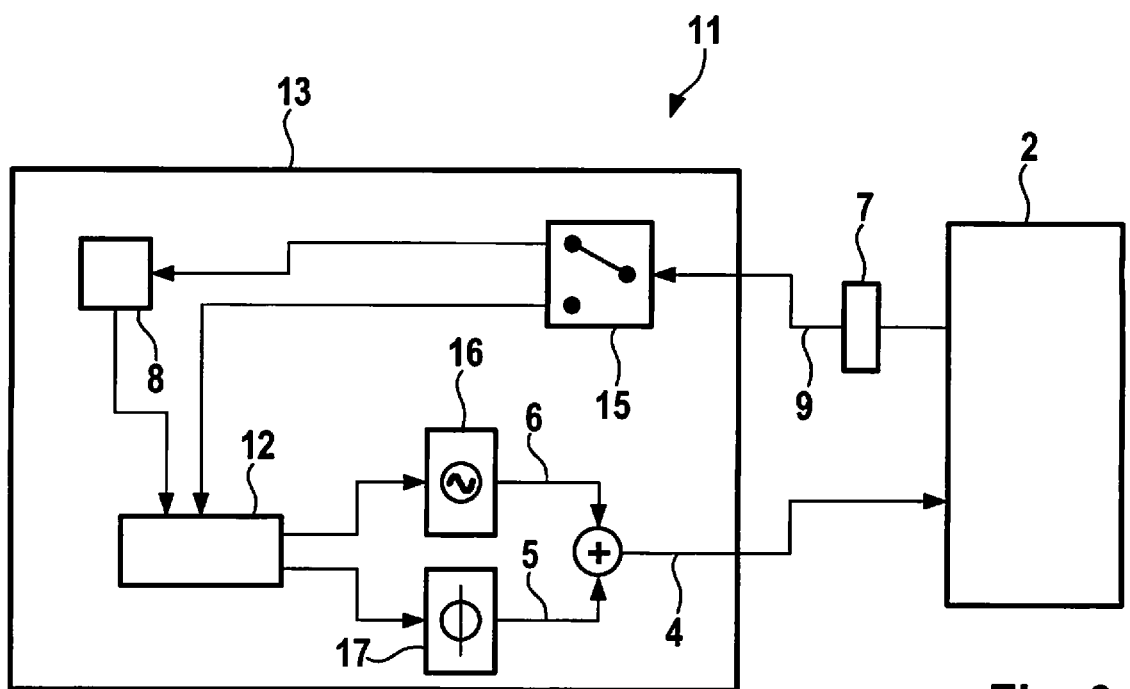
FIG. 3 is a block diagram of a microelectromechanical system according to another example embodiment of the present invention.

FIG. 3 is a block diagram of another example embodiment of a microelectromechanical system 11 according to the present invention. Microelectromechanical system 11 is based on microelectromechanical system 1 of FIG. 1 and expands it with a current measuring device 7, which detects current 9 flowing through piezoelectric drive 2 and provides it to control unit 13. The detection of admittance 10 and/or the impedance can therefore also be designed as a current measurement.

Control unit 13 differs from control unit 3 in that it includes a controller 12, which controls a DC voltage source 16 and an AC voltage source 17, whose output voltages are combined to form control voltage 4. In FIG. 3, DC voltage source 16 and an AC voltage source 17 are shown solely by way of example in control unit 13. DC voltage source 16 and AC voltage sources 17 outside control unit 13, which are controlled thereby, are also possible.

Furthermore, a changeover switch 15 is provided in control unit 13. In an example embodiment, changeover switch 15 can also simply be a software query in an operating program of control unit 13. Changeover switch 15 can switch over control unit 13 in a calibration phase of microelectromechanical system 11 in such a way that it detects and stores impedance 8 of piezoelectric drive 2. Control unit 13 can also extract features of piezoelectric drive 2 from impedance 8, which are required for the later control in normal operation. For example, control unit 13 can determine the above-mentioned capacitance change per length change dCdx based on impedance 8 in the calibration phase.

If control unit 13 is in normal operation, i.e., outside the calibration phase, current 9 is provided directly to controller 12, which computes the amplitude and the phase of piezoelectric drive 2 therefrom and carries out a corresponding regulation, as described above.

Figure 4:
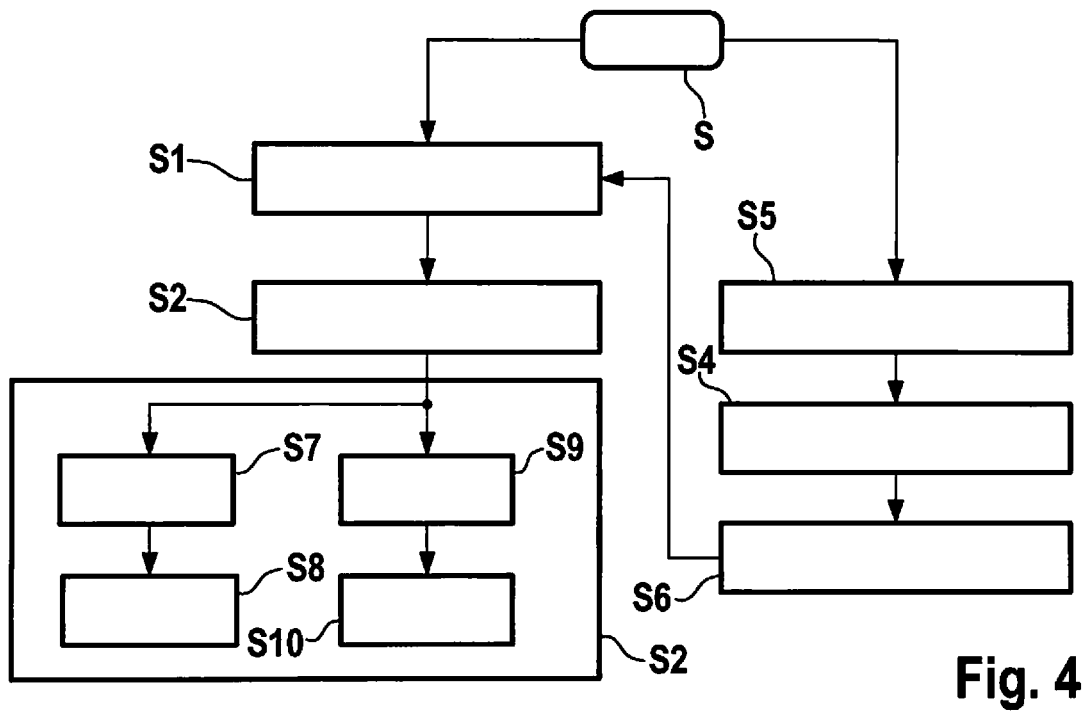
FIG. 4 is a flowchart of a method according to an example embodiment of the present invention.

FIG. 4 is a flowchart of an example embodiment of a method according to the present invention.

The method branches at the beginning either into normal operation S1, S3, S2 or into calibration phase S5, S4, S6. The calibration phase can be carried out automatically, for example, upon the start of microelectromechanical system 1, 11, if this was not yet the case.

In the calibration phase, piezoelectric drive 2 is exclusively excited S5 using an AC voltage component 6. In step S4, the current flowing through piezoelectric drive 2 is detected and a first impedance 8 of piezoelectric drive 2 is determined therefrom in step S6. Capacitance change per length change dCdx, which is necessary to later compute the amplitude and phase of the movement of piezoelectric drive 2, may be determined from impedance 8 as described above.

After completion of the calibration phase, the method is continued at step S1. In step S1, as already explained, the change of admittance 10 and/or impedance 8 of a piezoelectric drive 2 is detected.

In step S3, a control voltage 4, which includes a DC voltage component 5 and an AC voltage component 6 overlaid on DC voltage component 5, is provided to operate piezoelectric actuator 2.

Step S2 of FIG. 4 has a series of substeps S7 through S10. Step S7 provides that, based on first impedance 8 and a detected electric current 9 which flows through piezoelectric drive 2, the amplitude of the vibration of piezoelectric drive 2 is determined. Subsequently, based on the determined amplitude and a predefined setpoint amplitude, an amplitude regulation of piezoelectric drive 2 is carried out, S8. For this purpose, for example, DC voltage component 5 and/or AC voltage component 6 of control voltage 4 can be controlled.

To not only be able to regulate the amplitude, but rather also be able to regulate the phase of piezoelectric drive 2, the phase of the vibration of piezoelectric drive 2 is determined in step S9 based on first impedance 8 and detected electric current 9. This can take place as already described above. Subsequently, based on the determined phase and a predefined setpoint phase, a phase regulation of piezoelectric drive 2 is carried out, S10. For this purpose, for example, DC voltage component 5 and/or AC voltage component 6 of control voltage 4 can also be controlled.

Figure 5:
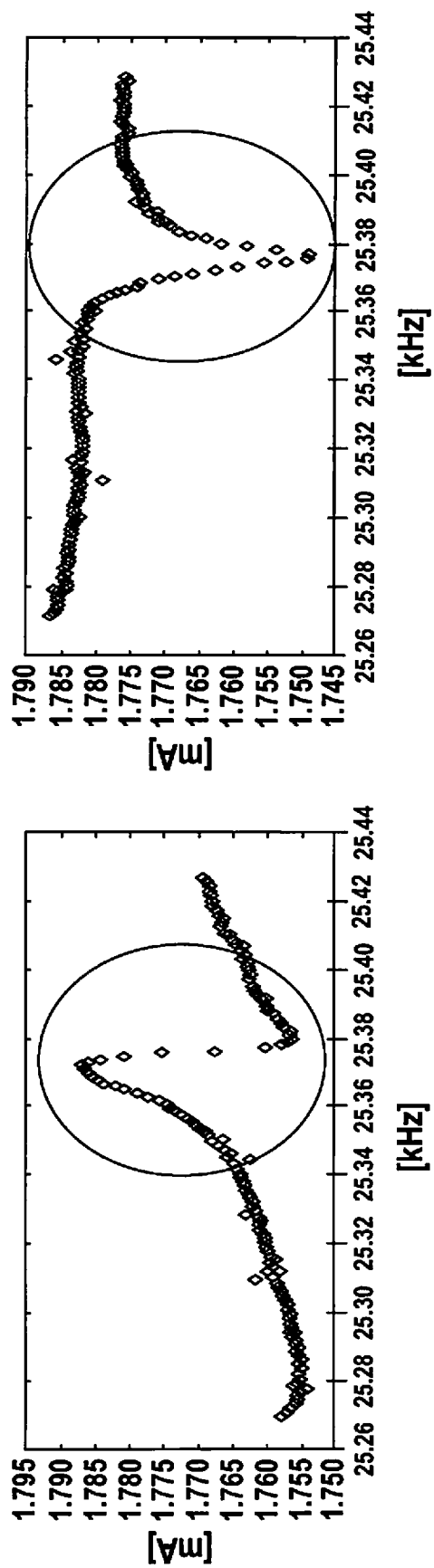
FIG. 5 shows diagrams including current measurements to illustrate subject matter of the present invention.
Figure 5:
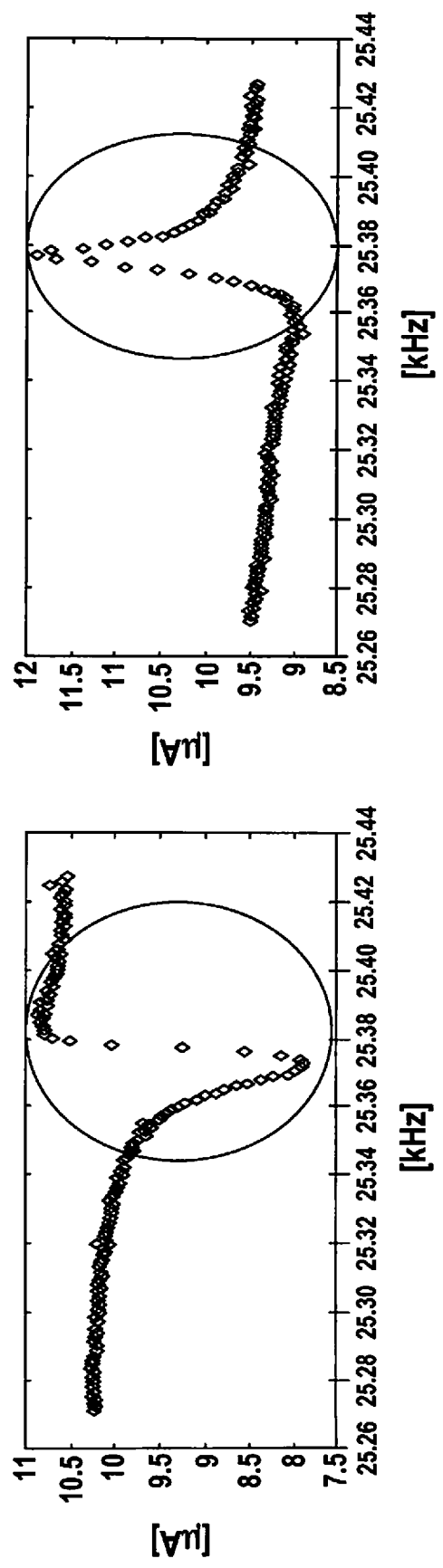

FIG. 5 shows four diagrams having current measurements to illustrate the subject matter of the invention. In each of the diagrams, the abscissa axes show the frequency in kilohertz. In the upper two diagrams, the ordinate axes each show the current in milliamps and in the lower two diagrams, the ordinate axes each show the current in microamps.

The two upper diagrams show the current component of the above-mentioned equation (3), which is dependent on the excitation frequency, i.e., the frequency of AC voltage component 6. The lower two diagrams show the current component of above-mentioned equation (3), which is proportional to double the excitation frequency. The left two diagrams each show in-phase component Y of the current and the right two diagrams each show corresponding out-of-phase component X.

In all four diagrams, the frequency at which microelectromechanical system 1, 11 is in resonant operation is clearly apparent.

It is clear from these diagrams and the above description how an amplitude and phase regulation of microelectromechanical system 1, 11 can be carried out solely by a current measurement or an impedance or admittance determination.

Although the present invention was described above on the basis of preferred exemplary embodiments, it is not restricted thereto, but is rather modifiable in a variety of ways. In particular, the present invention can be changed or modified in manifold ways, without departing from the core of the present invention.

What is claimed is:

1. A microelectromechanical system comprising:
   a piezoelectric drive; and
   a control unit coupled to the piezoelectric drive, wherein the control unit is configured to control the piezoelectric drive based on a change of at least one of an admittance and an impedance of the piezoelectric drive, including by, in a normal operation:
      providing a control voltage, which includes a DC voltage component and an AC voltage component overlaid on the DC voltage component, to vibrate the piezoelectric drive;
      receiving, from a current measuring device, a current flowing through the piezoelectric drive while the piezoelectric drive is vibrated via the control voltage;
      determining an amplitude of the vibration based on a first impedance and the detected current; and
      regulating an amplitude of the vibration by adjusting the control voltage based on the determined amplitude and a predefined setpoint amplitude.

2. The microelectromechanical system of claim 1, wherein the control unit includes a controller configured to carry out the amplitude regulation of the piezoelectric drive based on the determined amplitude and the predefined setpoint amplitude.

3. The microelectromechanical system of claim 1, wherein the control unit includes a PI controller configured to carry out the amplitude regulation of the piezoelectric drive based on the determined amplitude and the predefined setpoint amplitude.

4. The microelectromechanical system of claim 1, wherein the control unit is configured to provide the control voltage to the piezoelectric drive.

5. The microelectromechanical system of claim 4, further comprising the current measuring device, wherein:
   the current measuring device is configured to detect the current flowing through the piezoelectric drive and provide an indication of the detected current to the control unit; and
   the control unit is configured to, in a calibration phase:
      exclusively excite the piezoelectric drive using the AC voltage component, whose frequency is outside a resonance frequency of the piezoelectric drive; and
      determine, based on the indicated detected current during the calibration phase, the first impedance of the piezoelectric drive during the excitation.

6. The microelectromechanical system of claim 5, wherein the control unit is configured to, in the normal operation, determine a phase of a vibration of the piezoelectric drive based on the first impedance and the indicated detected current in the normal operation.

7. The microelectromechanical system of claim 6, wherein the control unit includes a controller configured to carry out a phase regulation of the piezoelectric drive based on the determined phase and a predefined setpoint phase.

8. The microelectromechanical system of claim 6, wherein the control unit includes a PI controller configured to carry out a phase regulation of the piezoelectric drive based on the determined phase and a predefined setpoint phase.

9. A control method for a microelectromechanical system, the method comprising:
   detecting a change of at least one of an admittance and an impedance of a piezoelectric drive of the microelectromechanical system; and
   controlling, by a control unit, the piezoelectric drive based on the detected change, including by, in a normal operation:
      providing a control voltage, which includes a DC voltage component and an AC voltage component overlaid on the DC voltage component, to vibrate the piezoelectric drive;
      receiving from a current measuring device a current flowing through the piezoelectric drive while the piezoelectric drive is vibrated via the control voltage;
      determining an amplitude of the vibration based on a first impedance and the detected current; and regulating an amplitude of the vibration by adjusting the control voltage based on the determined amplitude and a predefined setpoint amplitude.

10. The control method of claim 9, further comprising, in a calibration phase:

detecting the current flowing through the piezoelectric drive, wherein, in the calibration phase, the piezoelectric drive is exclusively excited using the AC voltage component, whose frequency is outside a resonance frequency of the piezoelectric drive; and detecting the first impedance of the piezoelectric drive based on the current during the excitation.

11. The control method of claim 9, wherein the regulating is performed using a PI controller.

12. The control method of claim 9, wherein the controlling includes, in the normal operation, determining a phase of the vibration of the piezoelectric drive based on the first impedance and the electric current as detected in the normal operation.

13. The control method of claim 12, wherein the controlling includes regulating a phase of the piezoelectric drive based on the determined phase and a predefined setpoint phase.

14. The control method of claim 13, wherein the regulating is performed using a PI controller.

* * * * *